United States Patent
Afsahi et al.

(10) Patent No.: US 8,884,702 B2
(45) Date of Patent: Nov. 11, 2014

(54) POWER AMPLIFIER WITH SUPPLY SWITCHING

(75) Inventors: Ali Afsahi, San Diego, CA (US); Arya Reza Behzad, Poway, CA (US); Ali Karimi-Sanjaani, San Diego, CA (US); Dandan Li, San Diego, CA (US); Kyujin Oh, San Diego, CA (US); Prasad Sitaram, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 72 days.

(21) Appl. No.: 13/620,342

(22) Filed: Sep. 14, 2012

(65) Prior Publication Data

US 2014/0079096 A1    Mar. 20, 2014

(51) Int. Cl.
  *H03F 3/04* (2006.01)

(52) U.S. Cl.
  USPC ............................................ 330/297; 330/296

(58) Field of Classification Search
  USPC .......................................... 330/297, 296, 285
  See application file for complete search history.

(56) References Cited

U.S. PATENT DOCUMENTS

| | | | |
|---|---|---|---|
| 6,265,935 B1 * | 7/2001 | Kaneda et al. | 330/51 |
| 6,753,735 B2 * | 6/2004 | Arai et al. | 330/297 |
| 8,159,305 B2 * | 4/2012 | Kishii et al. | 330/297 |
| 8,446,219 B2 * | 5/2013 | Mohajeri et al. | 330/136 |
| 8,538,357 B2 * | 9/2013 | Pedersen et al. | 455/127.1 |

* cited by examiner

*Primary Examiner* — Henry Choe
(74) *Attorney, Agent, or Firm* — Garlick & Markison; Randy W. Lacasse (57) ABSTRACT

To improve upon efficiency of a transmitter's power amplifier during low power operation, a switching system is used to selectively switch between different (e.g., normal and reduced) power supplies. Suitable hardware/software in the form of circuitry, logic gates, and/or code functions to process, amplify, and transmit an input RF signal and selectively switch IN/OUT a plurality of supply voltages using control logic.

13 Claims, 9 Drawing Sheets

POWER AMPLIFIER WITH SUPPLY SWITCHING

BACKGROUND OF THE INVENTION

1. Technical Field of the Invention

This invention relates generally to wireless communication and more particularly to processes and circuits used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP, LTE, LTE Advanced, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to one or more antennas (e.g., MIMO) and may include one or more low noise amplifiers, one or more intermediate frequency stages, a filtering stage, and a data recovery stage. The low noise amplifier(s) receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Today's high frequency, high performance, and low power transmitters are very desirable as they have on-chip power amplifiers and good power conversion efficiency. In transmitters with internal power amplifiers, when it is needed to work at full power, they are run from the maximum battery supply available, but the same transmitter can be placed and used in an environment which only needs to send moderate or low power. In this case, running from battery supply is very inefficient as backing up from saturating power in the class AB amplifiers results in low efficiency. It is desirable to improve upon the efficiency of transmitter configurations.

Disadvantages of conventional approaches will be evident to one skilled in the art when presented in the disclosure that follows.

BRIEF SUMMARY OF THE INVENTION

The technology described herein is directed to an apparatus and methods of operation that are further described in the following Brief Description of the Drawings and the Detailed Description of the Invention. Other features and advantages will become apparent from the following detailed description made with reference to the accompanying drawings.

DETAILED DESCRIPTION OF THE INVENTION

Figure 1:
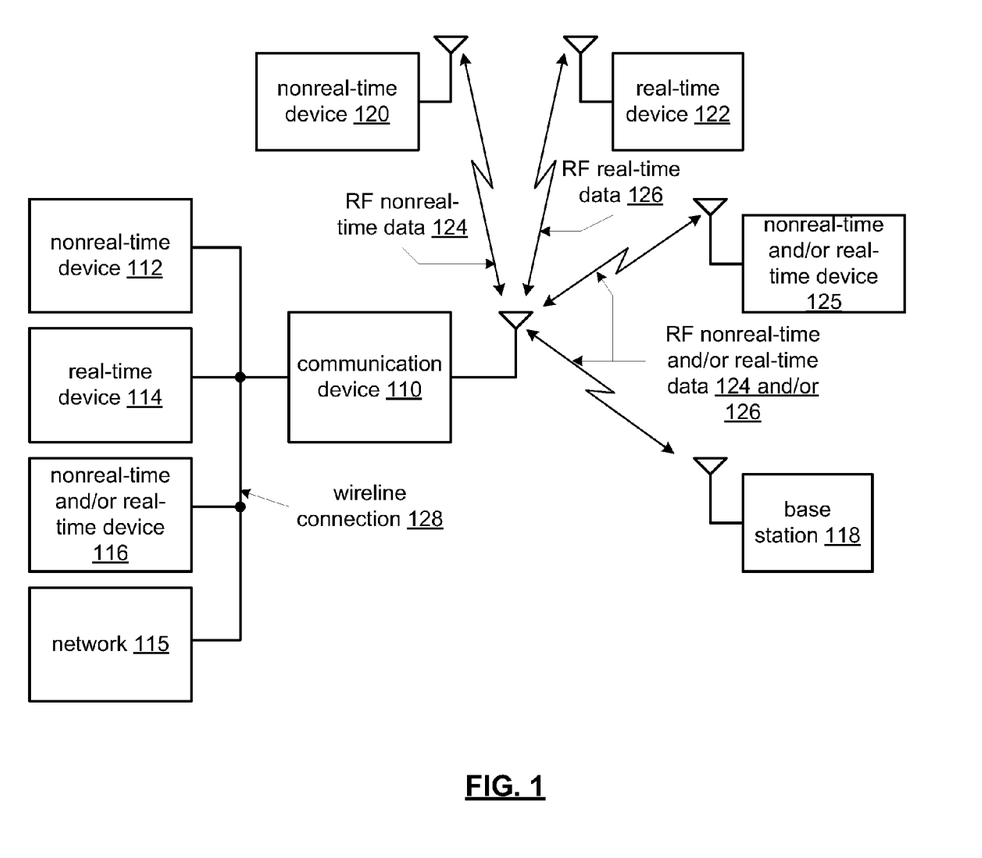
FIG. 1 is a schematic block diagram of an embodiment of a wireless communication system.

FIG. 1 is a schematic block diagram of a communication system in accordance with the technology described herein.

In particular, a communication system is shown that includes a communication device 110 that communicates real-time data 126 and/or non-real-time data 124 wirelessly with one or more other devices such as base station 118, non-real-time device 120, real-time device 122, and non-real-time and/or real-time device 125. In addition, communication device 110 can also optionally communicate over a wireline connection with network 115, non-real-time device 112, real-time device 114, and non-real-time and/or real-time device 116.

In an embodiment of the present invention the wireline connection 128 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 110.

Communication device 110 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 128 and/or the wireless communication path. Further communication device 110 can be an access point, base station or other network access device that is coupled to a network 115 such at the Internet or other wide area network, either public or private, via wireline connection 128. In an embodiment of the present invention, the real-time and non-real-time devices 112, 114 116, 118, 120, 122 and 125 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 126 includes voice, audio, video and multimedia applications including Internet gaming, etc. The non-real-time data 124 includes text messaging, email, web browsing, file uploading and downloading, etc.

In an embodiment of the present invention, the communication device 110 includes a wireless transceiver that includes one or more features or functions of the present invention. Such wireless transceivers shall be described in greater detail in association with FIGS. 2-11 that follow.

Figure 2:
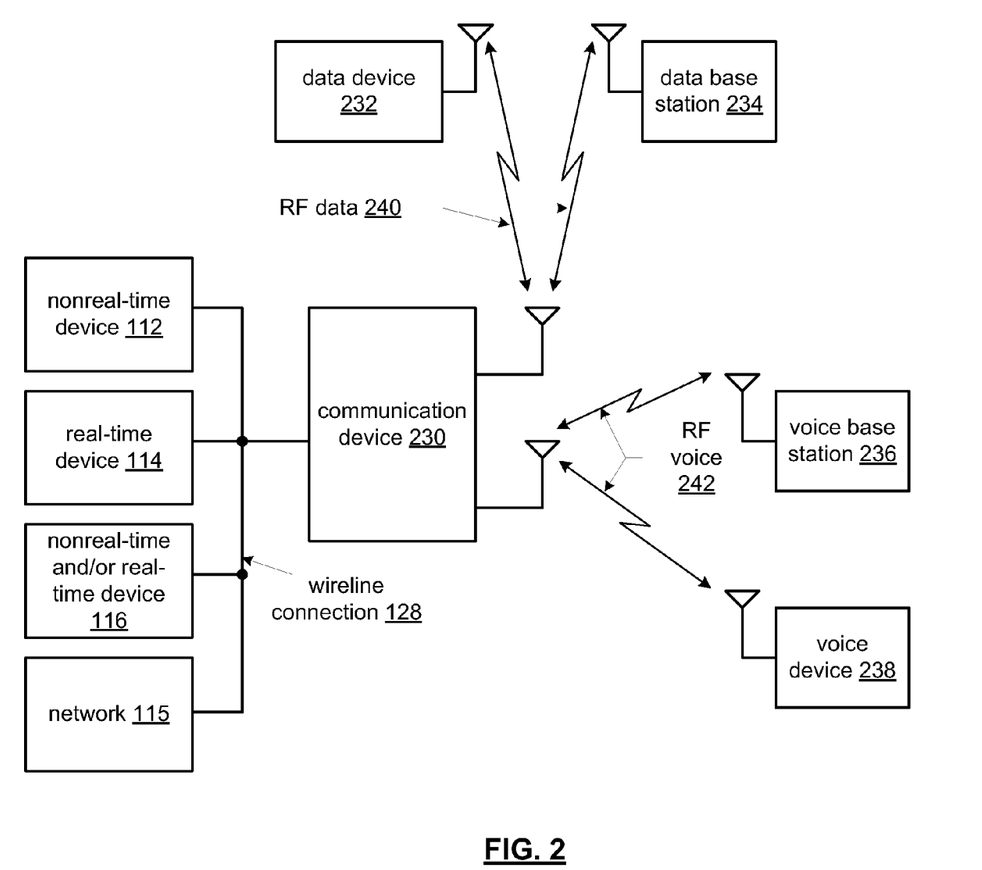
FIG. 2 is a schematic block diagram of another embodiment of a wireless communication system.

FIG. 2 is a schematic block diagram of an embodiment of another communication system in accordance with the present invention. In particular, FIG. 2 presents a communication system that includes many common elements of FIG. 1 that are referred to by common reference numerals. Communication device 230 is similar to communication device 110 and is capable of any of the applications, functions and features attributed to communication device 110, as discussed in conjunction with FIG. 1. However, communication device 230 includes two or more separate wireless transceivers for communicating, contemporaneously, via two or more wireless communication protocols with data device 232 and/or data base station 234 via RF data 240 and voice base station 236 and/or voice device 238 via RF voice signals 242.

Figure 3:
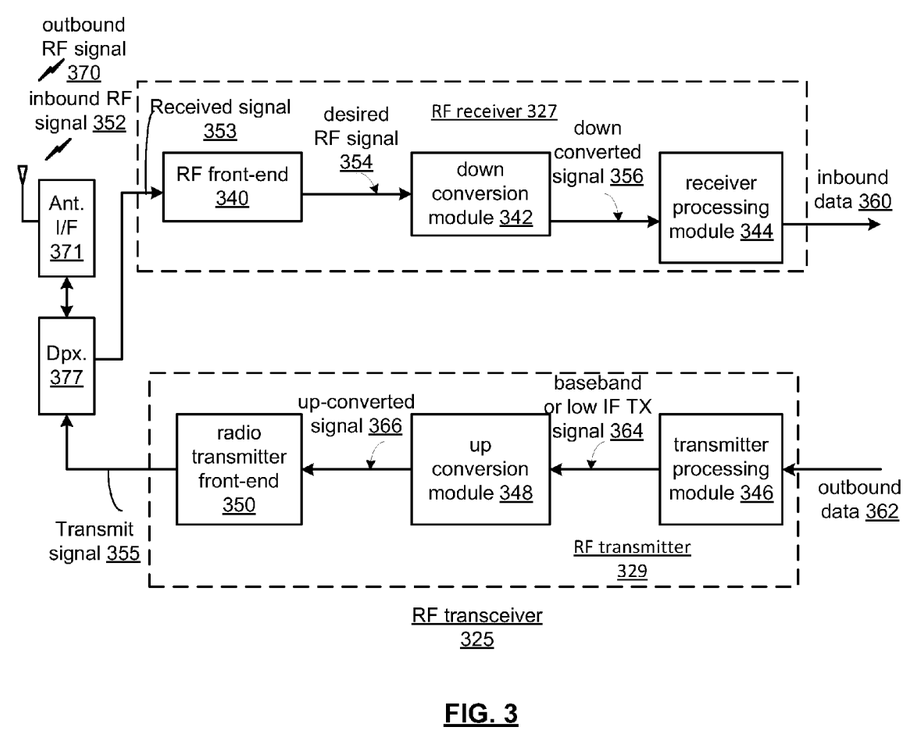
FIG. 3 is a schematic block diagram of an RF transceiver for a wireless communication system.

FIG. 3 is a schematic block diagram of an embodiment of a wireless transceiver 325 in accordance with the present invention. The RF transceiver 325 represents a wireless transceiver for use in conjunction with communication devices 110 or 230, base station 118, non-real-time device 120, real-time device 122, and non-real-time, real-time device 125, data device 232 and/or data base station 234, and voice base station 236 and/or voice device 238. RF transceiver 325 includes an RF transmitter 329, and an RF receiver 327. The RF receiver 327 includes a RF front end 340, a down conversion module 342 and a receiver processing module 344. The RF transmitter 329 includes a transmitter processing module 346, an up conversion module 348, and a radio transmitter front-end 350.

Figure 4:
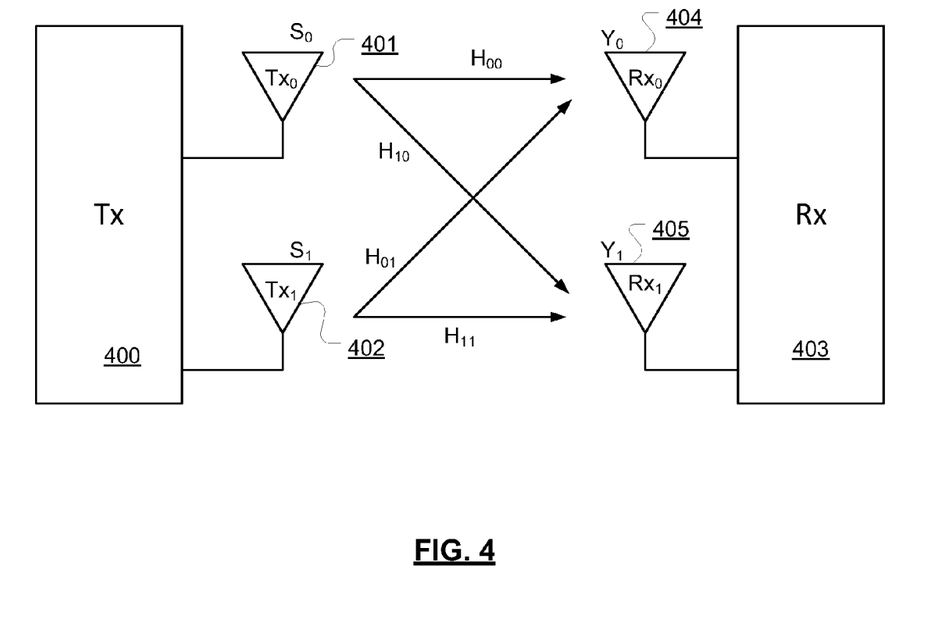
FIG. 4 is a schematic block diagram of a simple two antenna MIMO structure.

As shown, the receiver and transmitter are each coupled to an antenna through an antenna interface 371 and a diplexer (duplexer) 377, that couples the transmit signal 355 to the antenna to produce outbound RF signal 370 and couples inbound signal 352 to produce received signal 353. Alternatively, a transmit/receive switch can be used in place of diplexer 377. While a single antenna is represented in FIG. 3, the receiver and transmitter may share a multiple antenna structure that includes two or more antennas as shown in FIG. 4, discussed in greater detail hereafter.

In operation, the RF transmitter 329 receives outbound data 362. The transmitter processing module 346 packetizes outbound data 362 in accordance with a millimeter wave protocol or wireless telephony protocol, either standard or proprietary, to produce baseband or low intermediate frequency (IF) transmit (TX) signals 364 that includes an outbound symbol stream that contains outbound data 362. The baseband or low IF TX signals 364 may be digital baseband signals (e.g., have a zero IF) or digital low IF signals, where the low IF typically will be in a frequency range of one hundred kilohertz to a few megahertz. Note that the processing performed by the transmitter processing module 346 can include, but is not limited to, scrambling, encoding, puncturing, mapping, modulation, and/or digital baseband to IF conversion.

The up conversion module 348 includes a digital-to-analog conversion (DAC) module, a filtering and/or gain module, and a mixing section. The DAC module converts the baseband or low IF TX signals 364 from the digital domain to the analog domain. The filtering and/or gain module filters and/or adjusts the gain of the analog signals prior to providing it to the mixing section. The mixing section converts the analog baseband or low IF signals into up-converted signals 366 based on a transmitter local oscillation.

The radio transmitter front end 350 includes a power amplifier and may also include a transmit filter module. The power amplifier amplifies the up-converted signals 366 to produce outbound RF signals 370, which may be filtered by the transmitter filter module, if included. The antenna structure transmits the outbound RF signals 370 via an antenna interface 371 coupled to an antenna that provides impedance matching and optional band pass filtration.

The RF receiver 327 receives inbound RF signals 352 via the antenna and antenna interface 371 that operates to process the inbound RF signal 352 into received signal 353 for the receiver front-end 340. In general, antenna interface 371 provides impedance matching of antenna to the RF front-end 340, optional band pass filtration of the inbound RF signal 352.

The down conversion module 342 includes a mixing section, an analog to digital conversion (ADC) module, and may also include a filtering and/or gain module. The mixing section converts the desired RF signal 354 into a down converted signal 356 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 356 that includes an inbound symbol stream. Note that the ordering of the ADC module and filtering and/or gain module may be switched, such that the filtering and/or gain module is an analog module.

The receiver processing module 344 processes the baseband or low IF signal 356 in accordance with a millimeter wave protocol, either standard or proprietary, to produce inbound data 360 such as probe data received from a probe device or devices (not shown). The processing performed by the receiver processing module 344 can include, but is not limited to, digital intermediate frequency to baseband conversion, demodulation, demapping, depuncturing, decoding, and/or descrambling.

In an embodiment of the present invention, receiver processing module 344 and transmitter processing module 346 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 344 and transmitter processing module 346 are shown separately, it should be understood that these elements could be implemented separately, together through the operation of one or more shared processing devices or in combination of separate and shared processing.

In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 325. Each of these antennas may be fixed, programmable, and antenna array or other antenna configuration. Also, the antenna structure of the wireless transceiver may depend on the particular standard(s) to which the wireless transceiver is compliant and the applications thereof.

FIG. 4 illustrates a simple two antenna MIMO structure. A transmitting (Tx) unit 400 is shown having two antennas 401, 402, while a receiving (Rx) unit 403 is shown having two antennas 404, 405. It is to be noted that both transmitting unit 400 and receiving unit 403 are generally both transceivers, but are shown as separate Tx and Rx units for exemplary purpose in FIG. 4. That is, Tx unit 400 is transmitting data and Rx unit 403 is receiving the transmitted data.

The transmitted data symbols at antennas 401 ($Tx_0$), 402 ($Tx_1$) are noted as $S_0$ and $S_1$, respectively. The received data symbols at antennas 404 ($Rx_0$), 405 ($Rx_1$) are noted as $Y_0$ and $Y_1$ respectively. Since the example illustrates a two transmit antenna/two receive antenna MIMO system, the four resulting RF signal paths are noted as $H_{00}$, $H_{01}$, $H1_{10}$, and $H_{11}$ (using the $H_{Tx-Rx}$ notation) and the data path is referred to as channel H. While, the example illustrated is a two antenna structure, the embodiments disclosed herein may operate within other known and future multi-antenna configurations (e.g., 2×4, 2×8, 4×16, etc.)

Further details including optional functions and features of the RF transceiver are discussed in conjunction with FIGS. 5-11 that follow.

Figure 5:
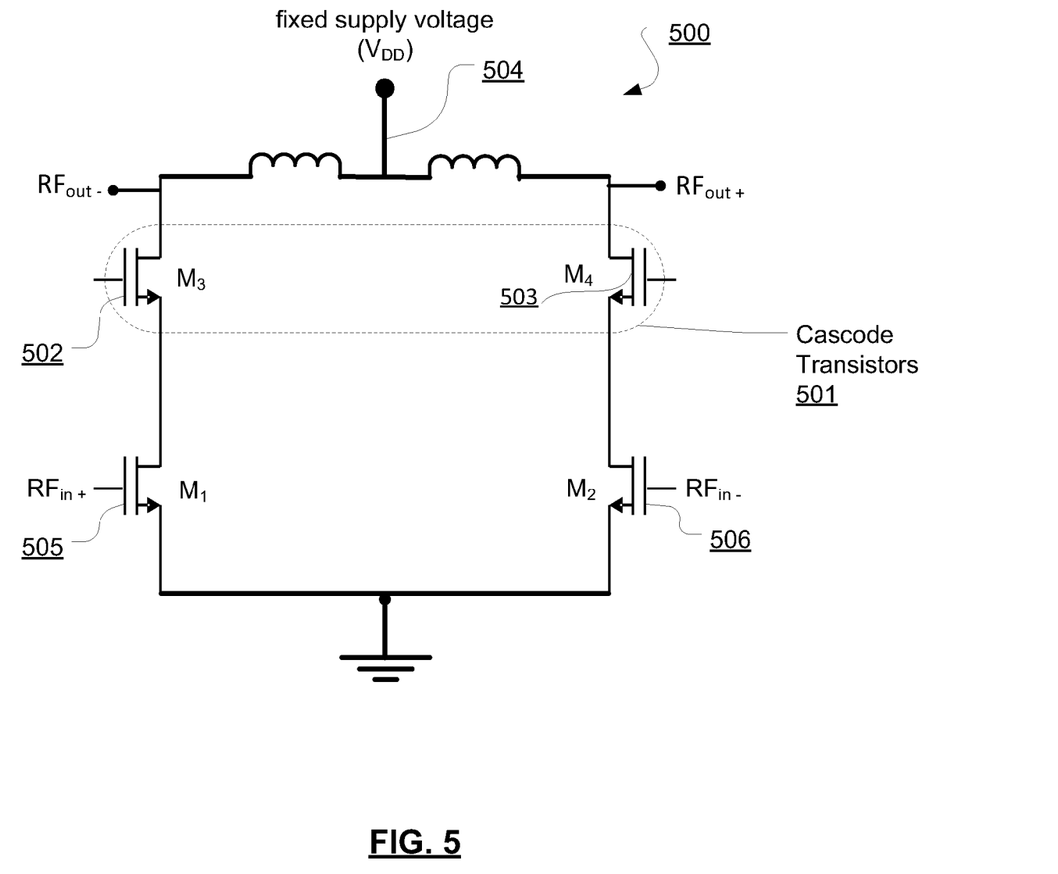
FIG. 5 illustrates one embodiment of a cascode integrated power amplifier (iPA) for a communication transceiver.

FIG. 5 illustrates an integrated power amplifier (iPA) for a communication transceiver. Power amplifier circuits are classified as A, B, AB and C for linear designs, and class D and E for switching designs. Class 'A' amplifiers are typically very inefficient, while class 'B' amplifiers typically fail to provide clean amplification. A good compromise is a class 'AB' amplifier. A class 'AB' amplifier is a class 'B' amplifier which has a small amount of 'bias' current flowing through the output transistors at all times. The bias current eliminates virtually all of the crossover distortion that's possible with class 'B' amplifiers. The bias current is flowing because output transistors are always conducting current (even without an input signal).

In class-AB operation, each device operates the same way as in class B over half the waveform, but also conducts a small amount on the other half. As a result, the region where both devices simultaneously are nearly off (the "dead zone") is reduced. The result is that when the waveforms from the two devices are combined, the crossover is greatly minimized or eliminated altogether. The exact choice of quiescent current, the standing current through both devices when there is no signal, makes a large difference to the level of distortion (and to the risk of thermal runaway, that may damage the devices); often the bias voltage applied to set this quiescent current has to be adjusted with the temperature of the output transistors.

As shown in FIG. 5, class AB power amplifier 500 may be arranged in a cascode configuration 501 of CMOS transistors. The cascode arrangement includes a first CMOS transistor 502 (M3) and second CMOS transistor 503 (M4). Input supply voltage 504 and cascode gate bias for transistors 502 and 503 are held fixed, independent of a transmitted envelope of an input RF signal. An RF signal to be amplified by the circuit is input ($RF_{in+}$) at CMOS transistor 505 (M1) and likewise RF signal ($RF_{in-}$) input through CMOS transistor 506 (M2). The amplified signal is output through $RF_{out+}/RF_{out-}$. However, for input RF signals with large dynamic range, like WLAN OFDM, this results in poor efficiency at low output power.

For input RF signals with large dynamic range, like WLAN OFDM, typical power amplifier operation results in poor efficiency at low output power as per:

$$\text{Efficiency of } PA \propto \frac{\text{Output voltage}}{V_{DD}} \times \frac{\text{Output current}}{\text{Quiescent current}}$$

In high dynamic range systems, like WLAN employing OFDM, the peak efficiency of the PA may be high (>40%), but the average transmit efficiency is very low (<18%), due to the high peak-to-average ratio of the signal. At low power, output voltage is much less than $V_{DD}$ and output current is less than quiescent current, and therefore efficiency for PAs is significantly lower. This happens because both $V_{DD}$ and the quiescent current (determined by $V_{GATE}$) are held fixed, independent of the transmitted power.

It is desirable to improve upon the efficiency of the circuit shown in FIG. 5 as well as other transmitter configurations. Therefore, in the technology as described herein, various embodiments include using a power supply switching system for lower transmitter power.

One way to address this issue is to run the power amplifier and its driver amplifier from a lower supply in these conditions. This technique increases the power efficiency when working in moderate and low power settings. In one embodiment, to benefit from both cases, working at high power from higher battery supply and working at medium and low power from another lower supply, supply switches are used. These supply switches need to tolerate high current going through them and exhibit very low series resistance. If controlling the supply of two amplifiers (power amp and driver amp), two sets of these switches are needed. Also to make the bias of amplifiers the same over the two supply values (to keep the linearity intact), bias circuitries of amplifiers should be run from the highest supply. When using two switches, they should not be on at the same time, since this would short the higher and lower supplies together. In an automatic control system for the logic of these switches, one switch is already off before turning the other one on.

Figure 6:
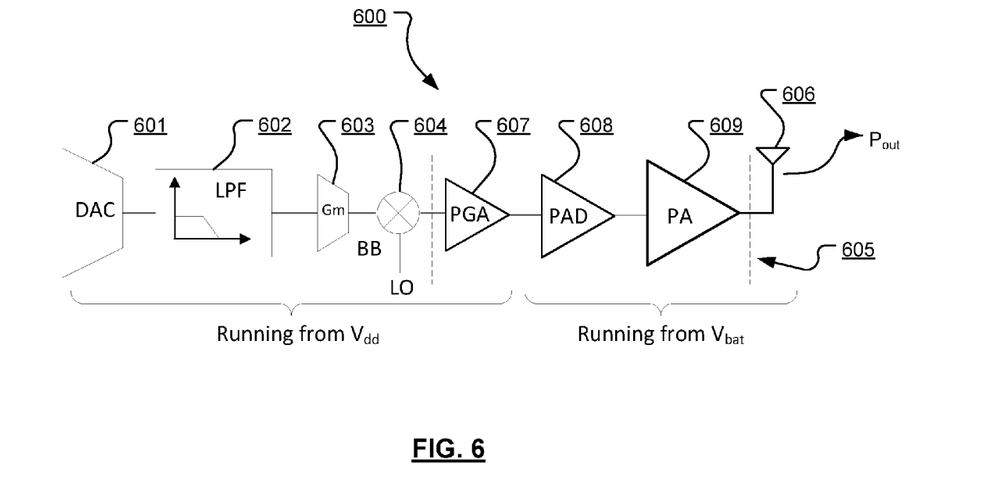
FIG. 6 illustrates one embodiment of a transmitter chain for an input RF signal.

FIG. 6 is a block diagram of an example transmitter 600 according to one embodiment of the technology described herein. Transmitter 600 includes digital-to-analog converter (DAC) 601, low-pass filter (LPF) 602, transconductance block (Gm) 603, up-converter 604, amplifier block 605, and antenna 606. In FIG. 6, digital communication signals to be transmitted are received at digital-to-analog converter (DAC) 601 and converted to analog communication signals. These analog signals are filtered by low-pass filter (LPF) 602 to remove, for example, unwanted adjacent channel energy. Transconductance block (Gm) 603 converts the filtered analog communication signals from voltages to currents. The converted communication signals are up-converted at up-converter 604 to RF (e.g., 2 GHz or 5 GHz signals) using local oscillator (LO). Up-converter 604 mixes the communication signals with the local oscillator signal to generate modulated RF signals which are provided to amplifier block 605 where the RF signals are amplified and transmitted through antenna 606.

Amplifier block 605 includes programmable gain amplifier (PGA) 607, power amplifier driver (PAD) 608, and power amplifier (PA) 609. The RF signal received by PGA 607 has a center frequency, which is referred to as the operating frequency $f_{op}$ of PGA 607 or PAD 608. PGA 607 amplifies the RF signal to provide sufficient signal strength to drive PAD 608. PAD 608 amplifies the signal received from PGA 607 to provide sufficient signal strength to drive PA 609. PGA 607 and PAD 608 are configured to charge and discharge respective gate-to-source capacitances quickly enough to provide sufficient power at frequencies near the upper threshold of a passband, for example. PA 608 amplifies the signal output from PAD 607, which is then transmitted by antenna 606. In this embodiment, the digital-to-analog converter 601, low-pass filter (LPF) 602, transconductance block 603, up-converter 604, and programmable gain amplifier (PGA) 607 are operated with supply voltage Vdd, while power amplifier driver (PAD) 608, and power amplifier (PA) 609 are operated at Vbat (battery voltage).

Figure 7:
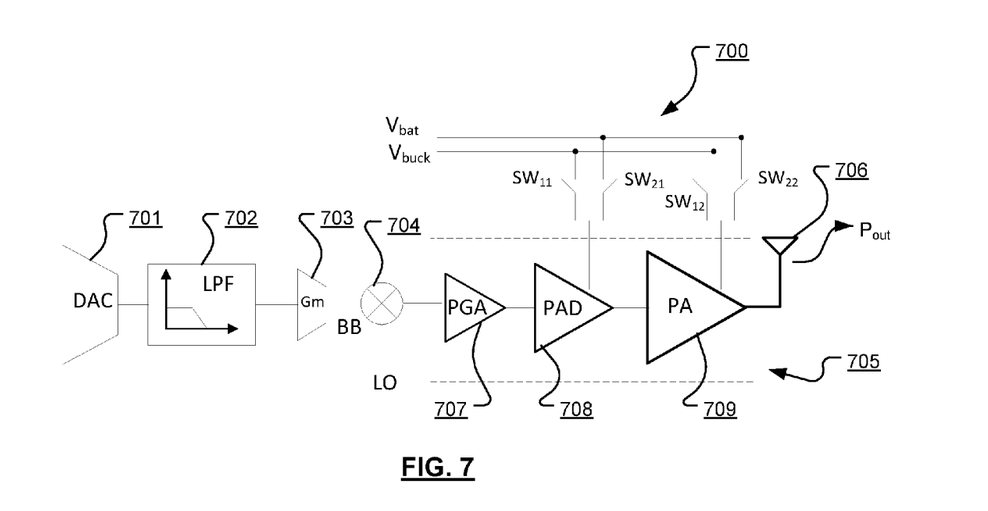
FIG. 7 illustrates one embodiment of a transmitter chain for an input RF signal with switched supply voltages.

FIG. 7 is a block diagram of an example transmitter 700 according to one embodiment of the technology described herein. Transmitter 700 includes digital-to-analog converter (DAC) 701, low-pass filter (LPF) 702, transconductance block (Gm) 703, up-converter 704, amplifier block 705, and antenna 706. In FIG. 7, digital communication signals to be transmitted are received at digital-to-analog converter 701 and converted to analog communication signals. These analog signals are filtered by low-pass filter (LPF) 702 to remove, for example, unwanted adjacent channel energy. Transconductance block (Gm) 703 converts the filtered analog communication signals from voltages to currents. The converted communication signals are up-converted at up-converter 704 to RF (e.g., 2 GHz or 5 GHz signals). Up-converter 704 mixes the baseband (BB) communication signals with a local oscillator (LO) signal to generate modulated RF signals which are provided to amplifier block 705 where the RF signals are amplified and transmitted through antenna 706.

Amplifier block 705 includes programmable gain amplifier (PGA) 707, power amplifier driver (PAD) 708, and power amplifier (PA) 709. The RF signal received by PGA 707 has a center frequency, which is referred to as the operating frequency $f_{op}$ of PGA 707 or PAD 708. PGA 707 amplifies the RF signal to provide sufficient signal strength to drive PAD 708. PAD 708 amplifies the signal received from PGA 707 to provide sufficient signal strength to drive PA 709. PGA 707 and PAD 708 are configured to charge and discharge respective gate-to-source capacitances quickly enough to provide sufficient power at frequencies near the upper threshold of a passband, for example. PA 708 amplifies the signal output from PAD 707, which is then transmitted by antenna 706. In this embodiment, the digital-to-analog converter 701, low-pass filter (LPF) 702, transconductance block (Gm) 703, up-converter 704, and programmable gain amplifier (PGA) 707 are operated with supply voltage Vdd. Power amplifier driver (PAD) 708 and power amplifier (PA) 709, include switches SW11, SW21, SW12, and SW22 which, using the control logic as further shown and described with respect to FIG. 9, switch between Vbat (battery voltage) and Vbuck (buck converter voltage) voltage supplies for both (PAD) 708, and power amplifier (PA) 709.

Figure 8:
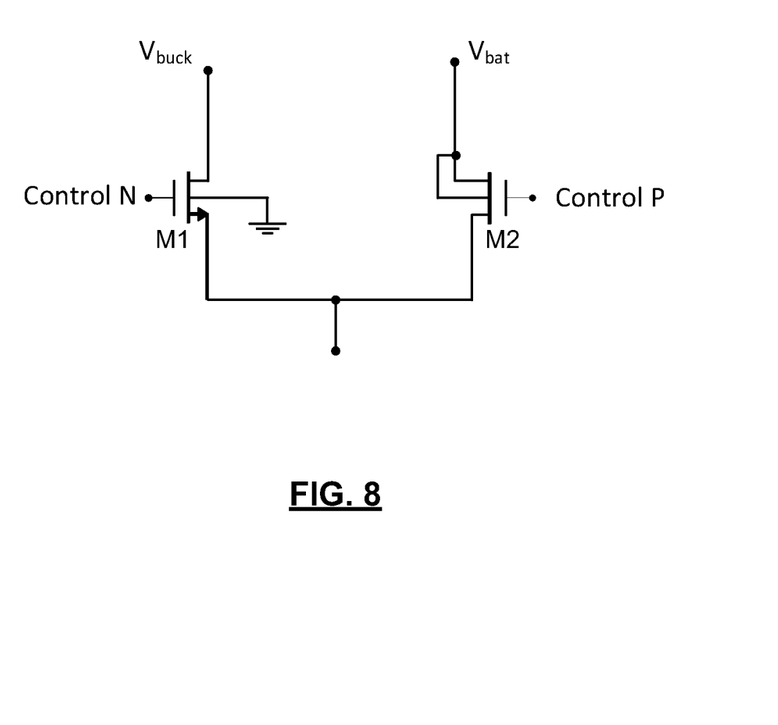
FIG. 8 illustrates an embodiment of a switching system for multiple supply voltages.

FIG. 8 illustrates an embodiment of the technology described herein which comprises suitable hardware in the form of circuitry that functions as either of the switch pairs "SW11 and SW21" or "SW12 and SW22" (FIG. 7) to selectively switch between Vbat and Vbuck, where Vbuck<Vbat. As shown, FIG. 8 includes transistors M1 and M2, which will provide either voltage sources Vbat or Vbuck, based on switching ON and OFF the transistors M1 and M2 by control signals Control N and Control P. These switches should be chosen to tolerate high current passing through them and can, in one embodiment, use thick oxide devices. In addition, they can, in one embodiment, be very large (high W/L) to have a low resistance and be able to tolerate the high current density. As such, layout configurations should consider electro-migration and latch-up. Vbuck is coming from an efficient buck converter/regulator. A buck converter is a very efficient voltage down-converter. Choosing the type of the switches is important to address proper biasing for them. PMOS is used for the high supply (Vbat), and NMOS is used for the low supply (Vbuck). This, together with proper logic control, ensures that switches are properly biased and controlled.

Figure 9:
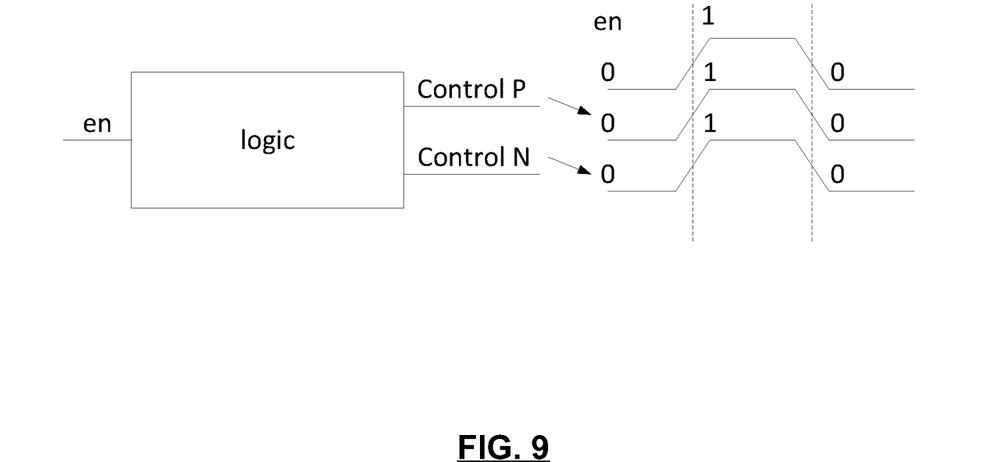
FIG. 9 illustrates an embodiment of control logic generation for a switching system for multiple supply voltages.

FIG. 9 illustrates an embodiment of the technology described herein which comprises suitable hardware in the form of control logic that functions to selectively switch between Vbat and Vbuck. As shown, the period that switches are ON is non-overlapping to ensure that supplies are not shorted together.

Figure 10:
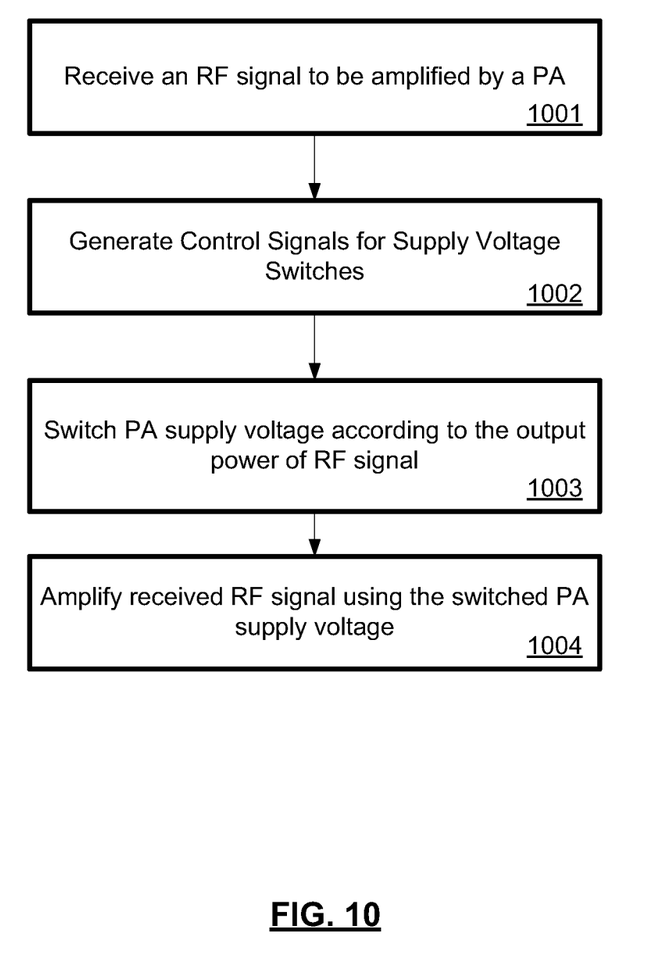
FIG. 10 illustrates an embodiment flow diagram of the technology described herein of a transmitter for an input RF signal with switched supply voltages.

FIG. 10 illustrates a flow diagram of the technology described herein with use of envelope information for a power amplifier. In step 1001, an RF signal to be amplified is received by the power amplifier. In step 1002, using logic from FIG. 9, the switching control signals are generated. In step 1003, the switching control signals are used to switch the power amplifier (PA) supply voltage by switching in Vbat and Vbuck. In step 1004, the power amplifier implementing the switched supply voltage, amplifies the input RF signal.

Figure 11:
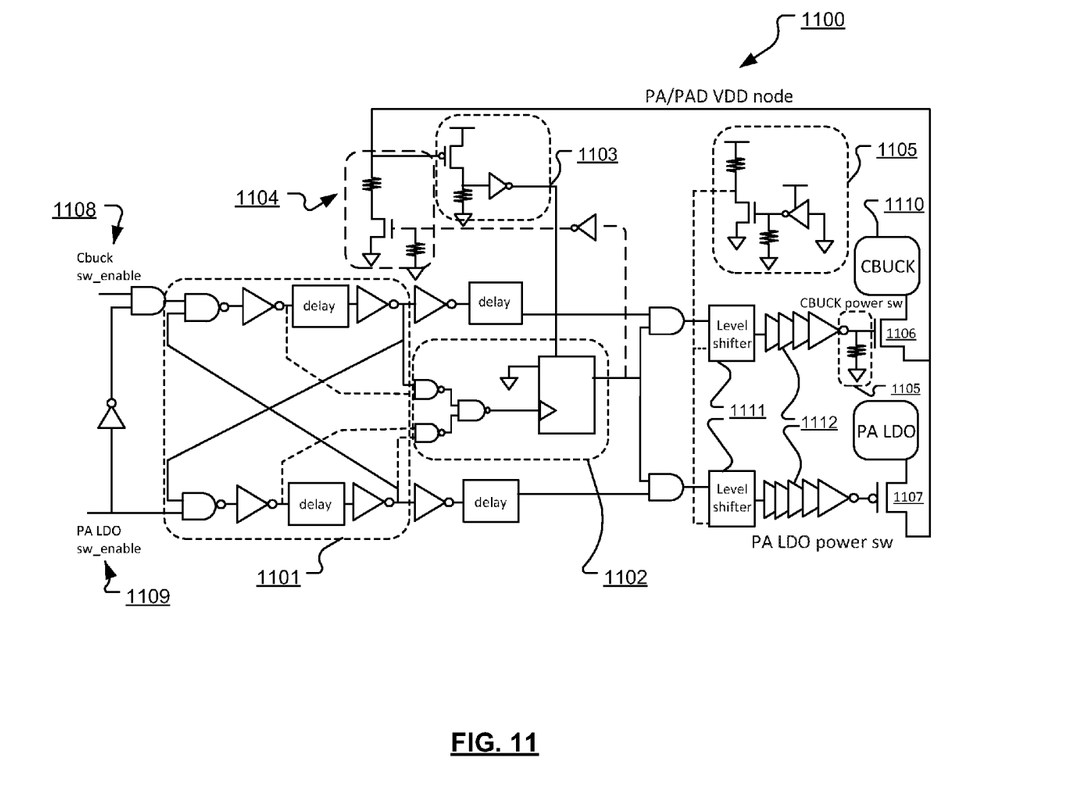
FIG. 11 illustrates an embodiment of the technology described herein of a PAD/PA switching system for multiple supply voltages.

FIG. 11 illustrates an example implementation of the technology described herein. As shown, the circuit 1100 comprises: non-overlap signal generation 1101, gating control circuit 1102, voltage detection circuit 1103, discharging circuit 1104, and pull down circuits 1105. Non-overlap control signals prevent two power switches 1106 and 1107 from turning on concurrently. As shown, non-overlap signal generation 1101 comprises, for example, a NAND gate based RS flip flop with inverters and delay cells for non-overlap time control. When either sw_enable (i.e., Cbuck sw_enable 1108 or PA LDO sw_enable 1109) goes high, gating control circuit 1102 disables two power switches 1106 and 1107 and enables discharging circuit 1104 until PA/PAD VDD node is discharged to a threshold voltage below 1.2V. This is to reduce the PA/PAD VDD node below 1.2V by the time these switches are turned ON, and to protect CBUCK 1110.

The voltage level at the PA/PAD VDD node is constantly monitored by voltage detection circuit 1103. Once the voltage at the PA/PAD VDD node decreases to a threshold voltage below 1.2V, gating control circuit passes sw_enable signal onto power switch input through voltage level shifter 1111 which converts 1.2V control signal to 3.3V signal followed by buffer stages 1112 to drive power switch (switches 1106 and 1107) input. Pull down circuits 1105 are incorporated to turn off power switches 1106 and 1107 in the case 1.2V supply for control logic is not powered up, but CBUCK and/or PA LDO are still alive.

While only two supply voltages are shown and described in the embodiments provided, additional supply voltages could be integrated within the circuits by one skilled in the art, using known methods, without departing from the scope of the technology described herein.

The communications power amplifier circuits described herein are operative in any of: a transmitter, transceiver, user equipment transceiver, base station transceiver, LTE transceiver or MIMO transceiver.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship.

As may also be used herein, the terms "processing module", "processing circuit", and/or "processing unit" may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as CMOS, as one of ordinary skill in the art will appreciate, the transistors may be implemented using any type of transistor structure including, but not limited to, bipolar, field effect (FET) or metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the technology as described herein have been expressly described herein, other combinations of these features and functions are likewise possible. The technology as described herein is not limited by the particular examples disclosed herein and expressly incorporates these other combinations.

The invention claimed is:

1. A wireless communications power amplifier circuit comprising:
   a power amplifier driver;
   a power amplifier connected to an output of the power amplifier driver; and
   a supply voltage switching system for the power amplifier driver and power amplifier, the supply voltage switching system selectively reducing the supply voltage during low output power operations from a battery supply voltage to a buck converter supply voltage, wherein the battery supply voltage and the buck converter supply voltage comprise Vbat and Vbuck, respectively, where Vbuck<Vbat; and a pair of switches for each of the power amplifier driver and the power amplifier for selecting between the Vbat and the Vbuck voltages.

2. The wireless communications power amplifier circuit, as per claim 1, wherein each of the pair of switches is connected to the battery and buck converter supply voltages.

3. The wireless communications power amplifier circuit, as per claim 1, wherein the pair of switches comprises a pair of CMOS transistors, each of the CMOS transistors connected to one of the battery and buck converter supply voltages.

4. The wireless communications power amplifier circuit, as per claim 3, wherein each of the CMOS transistors is selectively turned ON and OFF by control logic to thereby select one of the battery and buck converter-supply voltages.

5. The wireless communications power amplifier circuit, as per claim 3, wherein each of the CMOS transistors is selectively turned ON and OFF by control logic to prevent overlapping of the battery and buck converter-supply voltages.

6. The wireless communications power amplifier circuit, as per claim 1, wherein the wireless communications power amplifier circuit is operative in any of: a transmitter, transceiver, user equipment transceiver, base station transceiver, LTE transceiver or MIMO transceiver.

7. A method to optimize battery-powered power amplifier efficiency, the method comprising:
   receiving an input RF signal to the battery-powered power amplifier;
   generating a control signal for a supply voltage of the battery-powered power amplifier,
   switching the supply voltage of the battery-powered power amplifier according to the generated control signal, the switching step comprising varying the supply voltage according to an output power between a battery supply voltage and a buck converter supply voltage; and
   amplifying the received input RF signal using the battery-powered power amplifier with the switched supply voltage.

8. A method to optimize power amplifier efficiency, as per claim 7, wherein the step of switching the supply voltage comprises selectively turning ON/OFF a pair of switches for the battery and buck converter supply voltages.

9. A method to optimize power amplifier efficiency, as per claim 8, wherein the battery and buck converter supply voltages comprise Vbat and Vbuck, where Vbuck<Vbat.

10. A method to optimize power amplifier efficiency, as per claim 8, wherein the pair of switches comprises a pair of CMOS transistors, each of the CMOS transistors connected to one of the battery and buck converter supply voltages.

11. A method to optimize power amplifier efficiency, as per claim 10, wherein each of the CMOS transistors is selectively turned ON and OFF by control logic to thereby select one of the battery and buck converter-supply voltages.

12. A method to optimize power amplifier efficiency, as per claim 10, wherein each of the CMOS transistors is selectively turned ON and OFF by control logic to prevent overlapping of the battery and buck converter-supply voltages.

13. A method to optimize power amplifier efficiency, as per claim 7, wherein the steps are operative in any of: a transmitter, transceiver, user equipment transceiver, base station transceiver, LTE transceiver or MIMO transceiver.

* * * * *